United States Patent
Wang

(10) Patent No.: US 6,451,680 B1
(45) Date of Patent: Sep. 17, 2002

(54) METHOD FOR REDUCING BORDERLESS CONTACT LEAKAGE BY OPC

(75) Inventor: Hsueh-Wen Wang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/774,456

(22) Filed: Jan. 31, 2001

(51) Int. Cl.$^7$ ................................................ H01L 21/44
(52) U.S. Cl. ....................... 438/597; 438/598; 438/795; 438/942
(58) Field of Search ................... 438/597, 598, 438/795, 947, 942, 352, 198, 296, 5, 30

(56) References Cited

U.S. PATENT DOCUMENTS 6,080,527 A * 6/2000 Huang et al.
6,282,696 B1 * 8/2001 Garza et al.

* cited by examiner

Primary Examiner—Keith Christianson
Assistant Examiner—Yennhu B. Huynh
(74) Attorney, Agent, or Firm—Powell Goldstein Frazer & Murphy LLP

(57) ABSTRACT

This invention increases the overlapped area between the diffusion area and the borderless contact by using optical proximity correction (OPC) method. The method includes performing an optical proximity correction on an outer corner of an active area mask to enlarge a portion of an outer corner of an active area on a substrate in a photolithography process, wherein the outer corner of the active area is used to make contact with a borderless contact. The enlarged portion of the outer corner of the active area increases the overlapped area between the borderless contact and the active area, and reduces borderless contact leakage.

10 Claims, 4 Drawing Sheets

METHOD FOR REDUCING BORDERLESS CONTACT LEAKAGE BY OPC

BACKGROUND OF THE INVENTION

1. Field of the Invention

The present invention generally pertains to a method for reducing borderless contact leakage, and more particularly to a method for reducing borderless contact leakage by optical proximity compensation (OPC) method.

2. Description of the Prior Art

Trench isolation is fast becoming the standard means of isolation in complex semiconductor devices, replacing the well established LOCOS (Localized Oxidation of Silicon) method of isolation. In a standard trench isolation process, trenches are formed in a semiconductor substrate between what are to become active areas that need to be isolated from one another. The trenches are filled with an insulating material, such as oxide, to provide electrical insulation. Active devices, including transistors and resistors, are then built and formed on and over the semiconductor substrate in appropriate active regions and between the isolation trenches.

One problem with the standard trench isolation process is leakage. A borderless contact is a contact which overlies and exposes both the active and isolation regions of the semiconductor substrate, usually for the purpose of making contact to a diffusion region formed in the substrate, as shown in FIG. 1. A substrate 10 is provided with trench isolation 20 formed therein, and a liner layer 22, such as silicon nitride, is usually formed between the isolation 20 and the substrate 10 such that borderless contact will automatically stop on this layer to prevent overetching of trench isolation 20 and leakage. A MOS (metal-oxide-semiconductor) transistor, which comprises gate electrode 30, source/drain regions 34 and spacers 32, is formed in and on the substrate 10. An interlevel dielectric layer 40 is deposited on the substrate 10 and a borderless contact 50 is formed in the dielectric. layer 40 to expose a portion of both source/drain regions and isolation 20.

However, mis-alignment will dominate the leakage when the borderless contact is off the border of diffusion. There is a phenomenon that the contact outside the diffusion with alignment off two sides of diffusion will have large leakage compared to contact inside the diffusion with off two sides of diffusion, as shown in FIG. 2 and FIG. 3. Referring to FIG. 2, an L-shaped diffusion region 12 from top view is provided and a borderless contact 50 is on the outer corner of the diffusion region 12. On the other hand, a borderless contact 50 on the inside of a diffusion area 12 is shown in FIG. 3. The overlapped region between contact and diffusion region in FIG. 2 is less than the overlapped region in FIG. 3.

Worst, the outer corner of a diffusion area pattern is rounded in exposure of a lithography process, as shown in FIG. 4 and FIG. 5. Contact 50 on the inside of diffusion region 12 will not reduce the overlapped area, as shown in FIG. 5. However, if contact 50 is on the outer corner of diffusion region 12, the overlapped area will be compressed, and leakage current will increase.

SUMMARY OF THE INVENTION

In accordance with the present invention, a method is provided for forming borderless contact that substantially increases the overlapped area between diffusion area and borderless contact and hence reduces borderless contact leakage.

In one embodiment, a method for reducing borderless contact leakage is provided. The method includes performing an optical proximity correction on an outer corner of an active area mask to form an active area on a substrate such that a portion of an outer corner of the active area is enlarged in the photolithography process. Then, a dielectric layer is deposited on the substrate. A borderless contact is formed in the dielectric layer to make contact with the outer corner of the active area, whereby the enlarged portion of the outer corner of the active area increases the overlapped area between the borderless contact and the active area, and reduces borderless contact leakage.

BRIEF DESCRIPTION OF THE DRAWINGS

The foregoing aspects and many of the attendant advantages of his invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

This invention utilizes optical proximity correction method on an outer corner of an active area mask to enlarge a portion of an outer corner of an active area on a substrate in a photolithography process, wherein the outer corner of the active area is used to make contact with a borderless contact. Optical proximity correction involves adding dark regions to and/or subtracting dark regions from a reticle design at locations chosen to overcome the distorting effects of diffraction and scattering. The enlarged portion of the outer corner of the active area increases the overlapped area between the borderless contact and the active area, and reduces borderless contact leakage. A preferred embodiment according to this invention is set forth below and is referred to in FIG. 6 and FIG. 7.

Figure 1:
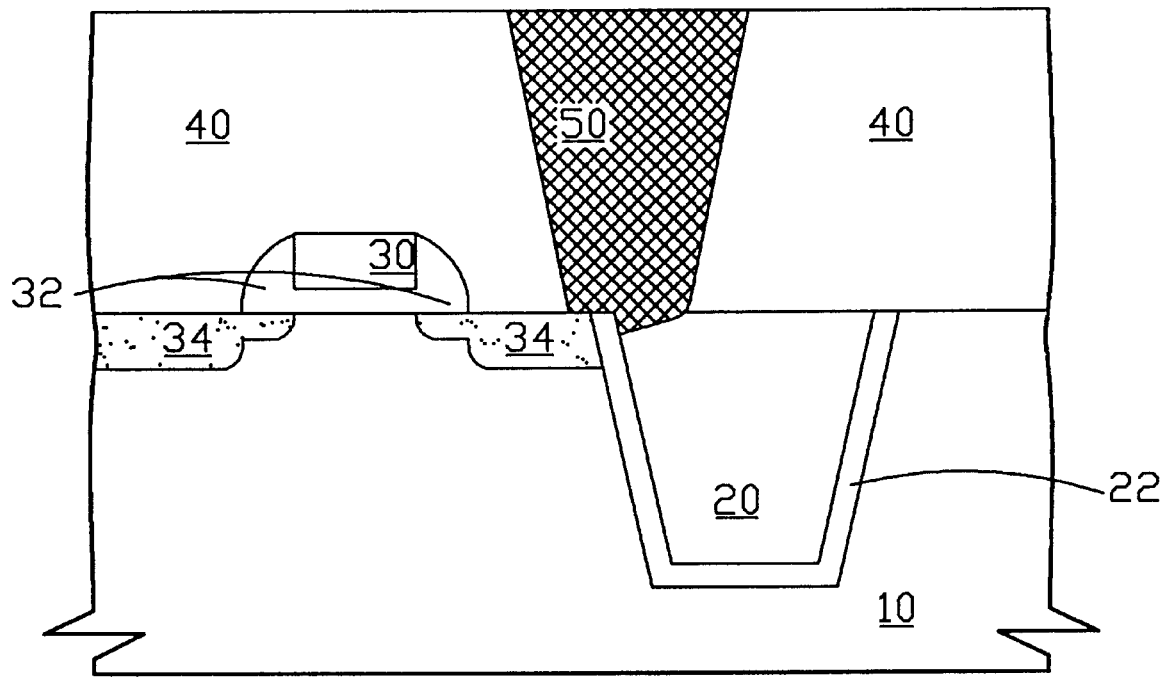
FIG. 1 is a schematic representation of a conventional borderless contact on a MOS transistor in a cross-view.
Figure 2:
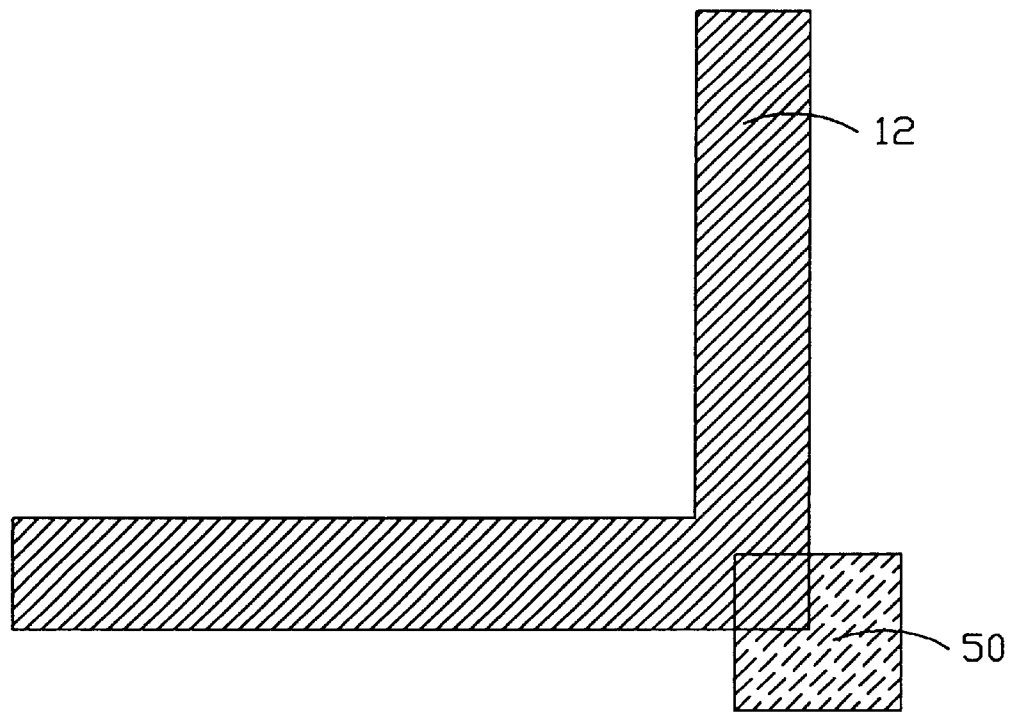
FIG. 2 illustrates an L-shaped diffusion region on a substrate with a borderless contact on the outer corner of the diffusion region.
Figure 3:
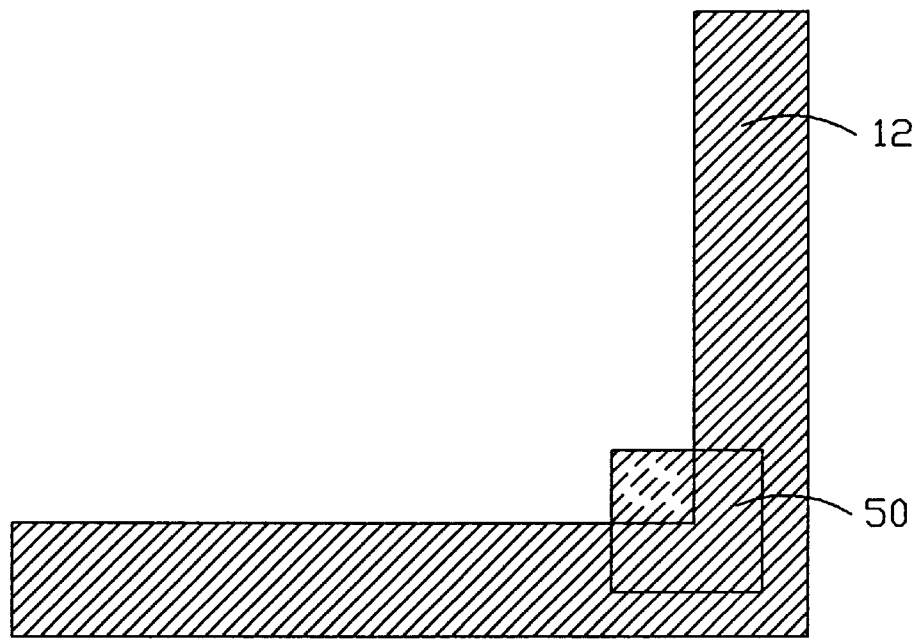
FIG. 3 illustrates an L-shaped diffusion region on a substrate with a borderless contact on the inside corner of the diffusion region.
Figure 4:
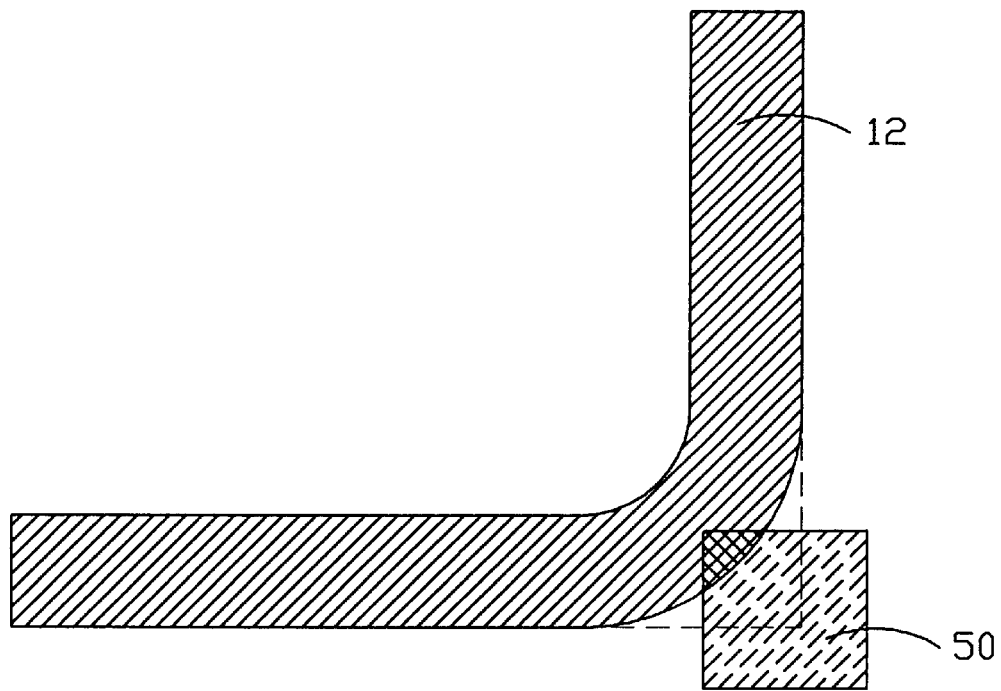
FIG. 4 shows an illumination pattern produced on a substrate by lighting an L-shaped reticle and a borderless contact on the outer corner of the pattern.
Figure 5:
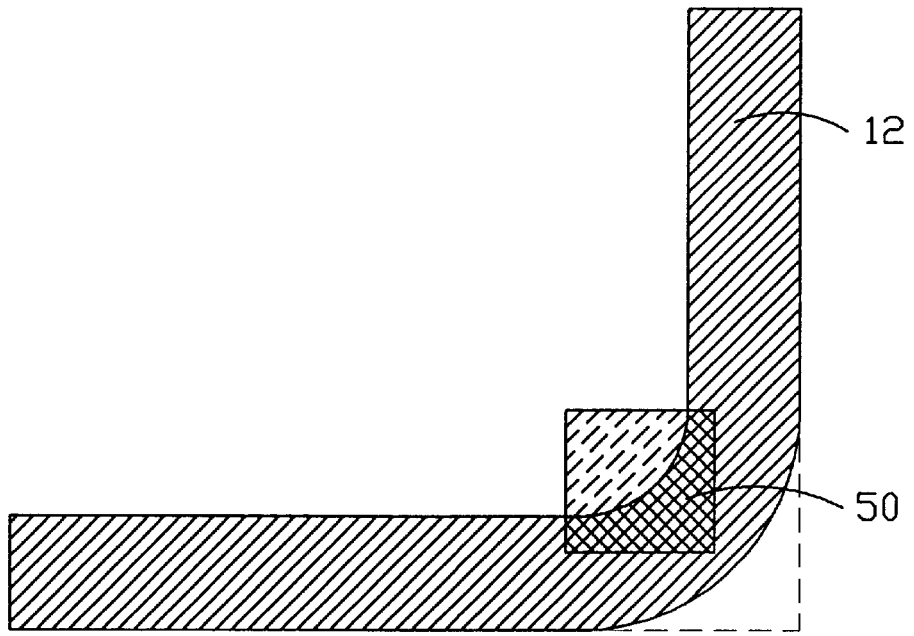
FIG. 5 shows an illumination pattern produced on a substrate by lighting an L-shaped reticle and a borderless contact on the inside corner of the pattern.
Figure 6:
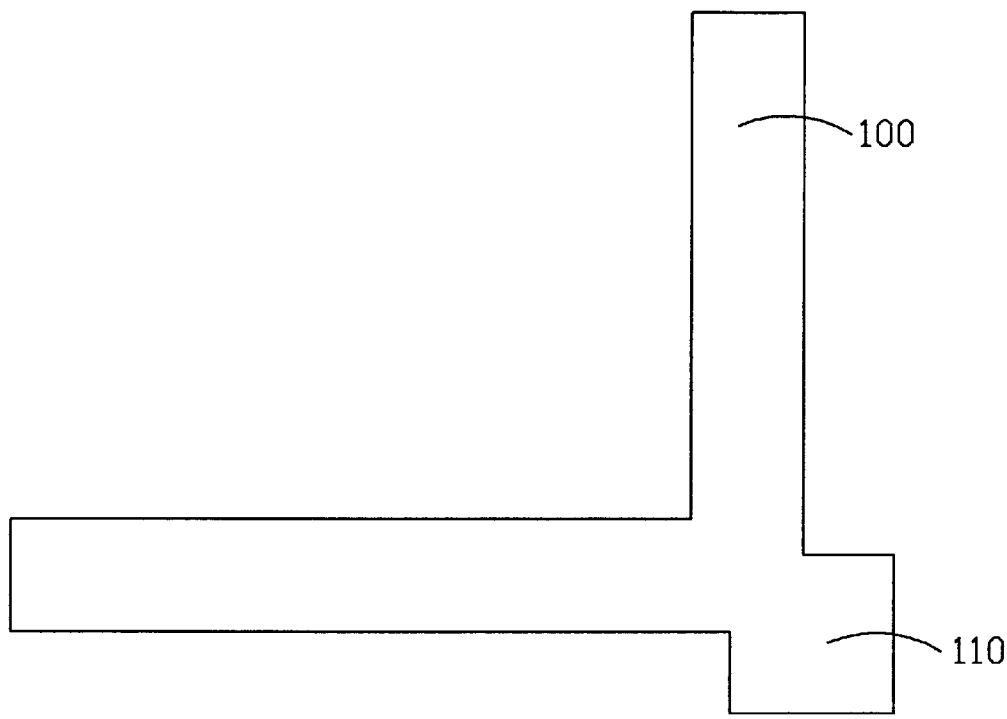
FIG. 6 illustrates a reticle in accordance with a method disclosed herein to overcome the rounding effect.
Figure 7:
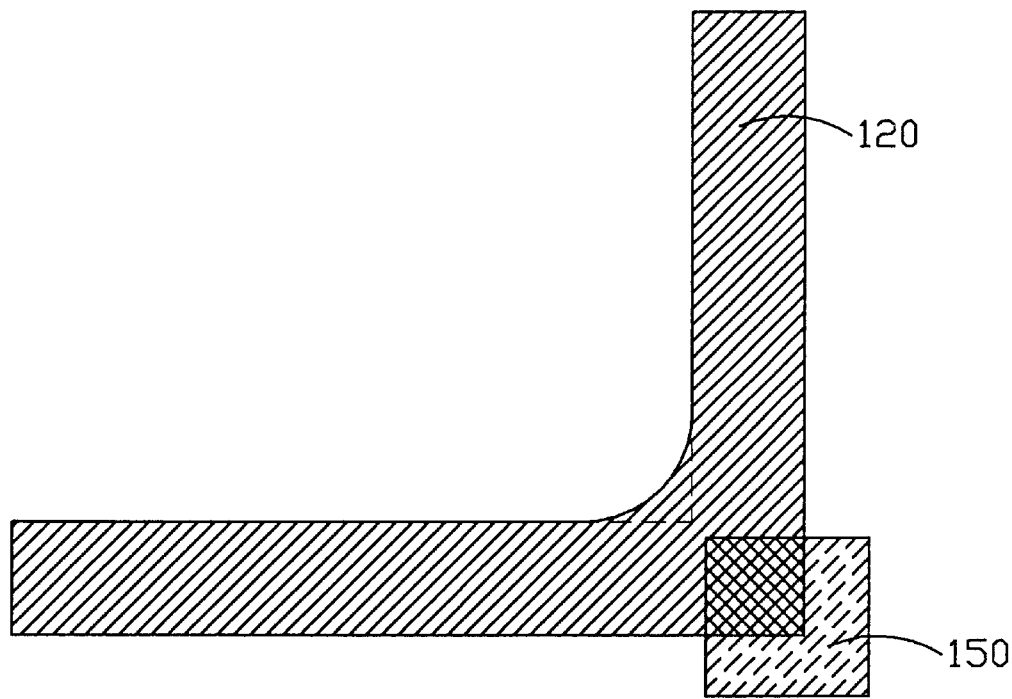
FIG. 7 is a schematic representation of a borderless contact on the outer corner of a diffusion area in accordance with a method disclosed.

Referring to FIG. 6, an L-shaped reticle 100 used for forming a diffusion area is provided, and a serif 110 defined by square chromium extensions protruding beyond the corners of base rectangle 100. The L-shaped region 100 and serif 110 is chromium on a glass to block radiation to generate an image corresponding to intended IC design features. This serif 110 will correct the shape of the outer corner of the diffusion area from a rounded corner to a more rectangular shape in lithography process. The size of serif 110 will depend upon real optical correction in lithography process.

Therefore, this corrected reticle 100 is used to form an L-shaped diffusion region 120 in a substrate. Then, an electronic device, such as MOS (metal-oxide-semiconductor) transistor, is formed in the diffusion region 120. A dielectric layer (not shown in FIG. 7) is then deposited on the substrate to cover the diffusion region 120 as well as the electronic device. The dielectric layer can be made from any typical and well-known dielectric material used in wafer fabrication, such as silicon oxide. Next, a borderless contact 150 is formed in the dielectric layer to make contact with the outer corner of the diffusion region 120. The enlarged portion of the outer corner of the diffusion area 120 increases the overlapped area between the borderless contact 150 and the diffusion area 120, and reduces borderless contact leakage.

According to the preferred embodiment of this invention, the outer corner of an L-shaped diffusion region is enlarged by using the OPC method and the overlapped area between the diffusion area and the borderless contact is increased. Therefore, borderless contact leakage is reduced.

Although specific embodiments have been illustrated and described, it will be obvious to those skilled in the art that various modifications may be made without departing from what is intended to be limited solely by the appended claims.

What is claimed is:

1. A method for reducing borderless contact leakage, said method comprising:

performing an optical proximity correction on an outer corner of an active area mask to enlarge a portion of an outer corner of an active area on a substrate in photolithography process, wherein said outer corner of said active area is used to make contact with a borderless contact;

whereby the enlarged portion of said outer corner of said active area increases overlapped area between said borderless contact and said active area, and reduces borderless contact leakage.

2. The method according to claim 1, wherein said active area comprises an electronic device.

3. The method according to claim 1, wherein said borderless contact is formed in a dielectric layer on said substrate.

4. The method according to claim 1, wherein said dielectric layer comprises silicon oxide.

5. A method for reducing borderless contact leakage, said method comprising:

performing an optical proximity correction on an outer corner of an active area reticle to form an active area on a substrate such that a portion of an outer corner of said active area is enlarged in photolithography process;

depositing a dielectric layer on said substrate;

forming a borderless contact in said dielectric layer to make contact with said outer corner of said active area, whereby said enlarged portion of said outer corner of said active area increases overlapped area between said borderless contact and said active area, and reduces borderless contact leakage.

6. The method according to claim 5, wherein said active area comprises an electronic device.

7. The method according to claim 5, wherein said dielectric layer comprises silicon oxide.

8. A method for reducing borderless contact leakage by using optical proximity correction method, said method comprising:

providing a substrate;

forming an L-shaped diffusion region in said substrate, wherein a portion of an outer corner of said diffusion region is enlarged by using optical proximity correction method in photolithography process;

forming an electronic device in said diffusion region;

depositing a dielectric layer on said substrate;

forming a borderless contact in said dielectric layer to make contact with said outer corner of said diffusion region, whereby said enlarged portion of said outer corner of said active area increases overlapped area between said borderless contact and said active area, and reduces borderless contact leakage.

9. The method according to claim 8, wherein said diffusion region comprises an electronic device.

10. The method according to claim 8, wherein said dielectric layer comprises silicon oxide.

* * * * *